(12) United States Patent
Yoon

(10) Patent No.: US 10,878,728 B2
(45) Date of Patent: Dec. 29, 2020

(54) FLEXIBLE DISPLAY APPARATUS

(71) Applicant: LG Display Co., Ltd., Seoul (KR)

(72) Inventor: Kyoung Sang Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/510,326

(22) Filed: Jul. 12, 2019

(65) Prior Publication Data

US 2020/0020255 A1 Jan. 16, 2020

(30) Foreign Application Priority Data

Jul. 13, 2018 (KR) .......................... 10-2018-0081396

(51) Int. Cl.
| | |
|---|---|
| G06F 1/16 | (2006.01) |
| G09F 9/30 | (2006.01) |
| G02F 1/1333 | (2006.01) |
| H05K 5/00 | (2006.01) |
| H05K 5/02 | (2006.01) |
| H01L 51/00 | (2006.01) |

(52) U.S. Cl.
CPC ........ G09F 9/301 (2013.01); G02F 1/133305 (2013.01); G06F 1/1652 (2013.01); H05K 5/0017 (2013.01); H05K 5/0217 (2013.01); H01L 51/0097 (2013.01)

(58) Field of Classification Search
CPC ............................... G09F 9/301; G06F 1/1652
USPC ............... 361/679.02, 679.3, 679.55, 679.56
See application file for complete search history.

(56) References Cited

U.S. PATENT DOCUMENTS

| | | | | |
|---|---|---|---|---|
| 9,743,542 | B2* | 8/2017 | Heo | G06F 1/1652 |
| 10,008,135 | B2* | 6/2018 | Lim | H05K 5/0226 |
| 10,061,358 | B2* | 8/2018 | Lee | H04M 1/0268 |
| 10,074,824 | B2 | 9/2018 | Han et al. | |
| 10,143,095 | B2* | 11/2018 | Kim | G06F 3/041 |
| 10,209,742 | B2* | 2/2019 | Shin | G06F 1/1624 |
| 10,379,720 | B2* | 8/2019 | Ryu | G09G 5/373 |
| 10,448,521 | B2* | 10/2019 | Seo | G09F 9/301 |
| 2008/0198541 | A1* | 8/2008 | Lin | G06F 1/1652 |
| | | | | 361/679.05 |
| 2013/0058063 | A1* | 3/2013 | O'Brien | G06F 1/1652 |
| | | | | 361/807 |

(Continued)

FOREIGN PATENT DOCUMENTS

| | | |
|---|---|---|
| KR | 10-2016-0141255 A | 12/2016 |
| KR | 10-2018-0036904 A | 4/2018 |

*Primary Examiner* — Anthony Q Edwards
(74) *Attorney, Agent, or Firm* — Seed IP Law Group LLP

(57) ABSTRACT

A flexible display apparatus includes a display panel including a first region, a second region, and a third region between the first region and the second region, a housing movably supporting the display panel, and a frame movably disposed in the housing to stretch or contract based on movement of the display panel, wherein the frame includes a fixing part fixed to the housing to movably support the first region of the display panel, a sliding part coupled to the second region of the display panel and movably disposed in the housing, and an elastic part elastically connected between the fixing part and the sliding part to support the third region of the display panel. Accordingly, a display area may be enlarged and reduced with only an action of a user's hand by using a frame without a separate driving power, and thus, total size and weight may decrease, thereby increasing the convenience of keeping and movement.

19 Claims, 10 Drawing Sheets

(56) References Cited

U.S. PATENT DOCUMENTS

| | | | |
|---|---|---|---|
| 2015/0138041 A1* | 5/2015 | Hirakata | G09G 5/14 |
| | | | 345/1.3 |
| 2016/0139633 A1* | 5/2016 | Lee | G06F 1/1652 |
| | | | 345/33 |
| 2016/0202729 A1* | 7/2016 | Lee | G06F 1/1652 |
| | | | 361/750 |
| 2016/0320804 A1* | 11/2016 | Takayanagi | G06F 1/1679 |
| 2017/0213486 A1* | 7/2017 | Zhou | G06F 1/1652 |
| 2018/0102072 A1* | 4/2018 | Lee | G06F 3/147 |
| 2018/0198896 A1* | 7/2018 | Kang | H04M 1/0216 |
| 2019/0104626 A1* | 4/2019 | Jeon | H04M 1/0268 |
| 2019/0297736 A1* | 9/2019 | Xu | H05K 1/028 |

* cited by examiner

FLEXIBLE DISPLAY APPARATUS

CROSS-REFERENCE TO RELATED APPLICATION

This application claims the benefit of the Korean Patent Application No. 10-2018-0081396 filed on Jul. 13, 2018, which is hereby incorporated by reference as if fully set forth herein.

BACKGROUND

Technical Field

The present disclosure relates to a flexible display apparatus.

Description of the Related Art

Recently, as society advances to the information-oriented society, the field of display apparatuses for displaying and displaying a massive amount of information has rapidly advanced, and correspondingly, various flat panel display apparatuses have been developed and are attracting much attention.

Flat panel display apparatuses use a glass substrate for enduring high heat which occurs in a manufacturing process, and due to this, there is a limitation in realizing thinness, weight-lightness, and flexibility.

Therefore, by using a material having flexibility like plastic instead of a glass substrate having no flexibility, flexible display apparatuses are manufactured to maintain display performance even when being bent like paper, and thus, are attracting much attention as next-generation flat panel display apparatuses.

By using a plastic substrate instead of glass, flexible display apparatuses may be categorized into unbreakable display apparatuses having high durability, bendable display apparatuses which are not broken and are bendable, rollable display apparatuses capable of being rolled, foldable display apparatuses, and slidable display apparatuses enabling a screen to be unloaded therefrom and inserted thereinto. Such flexible display apparatuses are good in space usability, interior, and design and may be applied to various application fields.

Particularly, research of slidable display apparatuses is being actively done for improving thinness, weight-lightness, miniaturization, and portability recently.

BRIEF SUMMARY

Accordingly, the present disclosure is directed to providing a flexible display apparatus that substantially obviates one or more problems due to limitations and disadvantages of the related art.

Described herein is a flexible display apparatus in which a display area is enlarged or reduced without a separate driving power.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a flexible display apparatus including a display panel including a first region, a second region, and a third region between the first region and the second region, a housing movably supporting the display panel, and a frame movably disposed in the housing to stretch or contract based on movement of the display panel, wherein the frame includes a fixing part fixed to the housing to movably support the first region of the display panel, a sliding part coupled to the second region of the display panel and movably disposed in the housing, and an elastic part elastically connected between the fixing part and the sliding part to support the third region of the display panel.

A flexible display apparatus may be summarized as comprising: a display panel including a first region, a second region, and a third region, wherein the third region is located between the first region and the second region; a housing movably supporting the display panel; and a frame movably disposed in the housing to stretch or contract based on movement of the display panel, the frame including: a first portion fixed to the housing to movably support the first region of the display panel; a second, sliding portion coupled to the second region of the display panel and movably disposed in the housing; and a third, elastic portion elastically connected to the first portion and to the second, sliding portion to support the third region of the display panel.

The housing may comprise: a first housing sidewall supporting a first side edge of the frame; a second housing sidewall disposed in parallel with the first housing sidewall to support a second side edge of the frame; a third housing sidewall connected to a first side of the first housing sidewall and to a second side of the second housing sidewall; and a guide roller rotatably connected to a second side of the first housing sidewall opposite to the first side of the first housing sidewall and to a second side of the second housing sidewall opposite to the first side of the second housing sidewall. One or more of the first region, the second region, and the third region may display different images. The guide roller may support the third region of the display panel when the display panel is sliding, and the frame may stretch or contract along the guide roller.

The flexible display apparatus may further comprise a stopper installed in the housing to restrain sliding of the display panel. When a portion of the second region of the display panel is outside of the housing, the stopper may restrain sliding of the display panel. When the display panel is restrained by the stopper, the frame may have a first length, the display panel may have a second length, and the first length may be the same as the second length. When restraint of sliding of the display panel by the stopper is released, the frame may have a first length, the display panel may have a second length, and the first length may be smaller than the second length. The stopper may comprise: a first cylindrical body installed in the housing so as to be raised or lowered in a first axial direction; and a second cylindrical body disposed in the housing so as to move in a second axial direction based on of movement of the first cylindrical body.

The flexible display apparatus may further comprise: a first elastic member allowing the second cylindrical body to protrude from the housing, based on a first elastic restoring force provided by the first elastic member; and a second elastic member allowing the first cylindrical body to protrude from the housing, based on a second elastic restoring force provided by the second elastic member, wherein the first elastic restoring force is greater than the second elastic restoring force. The housing may comprise a stepped portion, wherein a first side of the stepped portion protrudes further to an outer side of the housing than a second side of the stepped portion. The third, elastic portion of the frame may support a portion of the third region of the display panel. The flexible display apparatus may further comprise a stopper installed in the housing to restrain sliding of the display panel, wherein the stopper is disposed in parallel with the third region of the display panel supported by the third, elastic portion of the frame, and wherein the stopper restrains sliding of the display panel.

An apparatus may be summarized as comprising: a housing; an expandable frame having a first portion directly coupled to the housing, a second portion directly coupled to the first portion, wherein the second portion is elastically expandable, and a third portion directly coupled to the second portion; and a flexible display panel including a first region, a second region adjacent to the first region, and a third region adjacent to the second region, wherein the third region is directly coupled to the third portion of the frame such that the second portion of the frame expands or contracts as the flexible display moves with respect to the housing.

The first region of the display may at least partially overlay the first portion of the frame, the second region of the display may at least partially overlay the second portion of the frame, and/or the third region of the display may at least partially overlay the third portion of the frame. The first region of the display may at least partially overlay a rear surface of the housing, the second region of the display may at least partially overlay a side surface of the housing, and/or the third region of the display may at least partially overlay a front surface of the housing.

In the display apparatus according to the present disclosure, a display area may be enlarged and reduced with only an action of a user's hand by using a frame without a separate driving power, and thus, total size and weight may decrease, thereby increasing the convenience of keeping and movement.

In addition to the aforesaid objects of the present disclosure, other features and advantages of the present disclosure will be described below, but will be clearly understood by those skilled in the art from descriptions below.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1A:
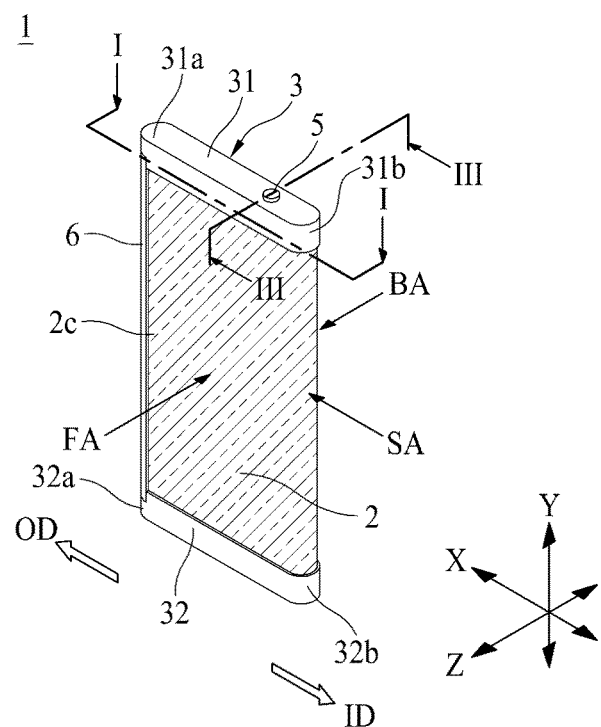
FIG. 1A is a schematic front perspective view illustrating an inserted state of a flexible display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. The terms are merely for differentiating one element from another element, and the essence, sequence, order, or number of a corresponding element should not be limited by the terms. It will be understood that when an element or layer is described as being "connected," "coupled," or "adhered" to another element or layer, the element or layer can be directly connected or adhered to the other element or layer, but the other element or layer can be "disposed" between elements or layers, or elements or layers can be "connected," "coupled," or "adhered" to each other through the other element or layer.

Features of various embodiments of the present disclosure may be partially or overall coupled to or combined with each other, and may be variously inter-operated with each other and driven technically as those skilled in the art can sufficiently understand.

The embodiments of the present disclosure may be carried out independently from each other, or may be carried out together in co-dependent relationship.

Hereinafter, embodiments of a flexible display apparatus according to the present disclosure will be described in detail with reference to the accompanying drawings. In adding reference numerals to elements of each of the drawings, although the same elements are illustrated in other drawings, like reference numerals may refer to like elements.

Figure 1B:
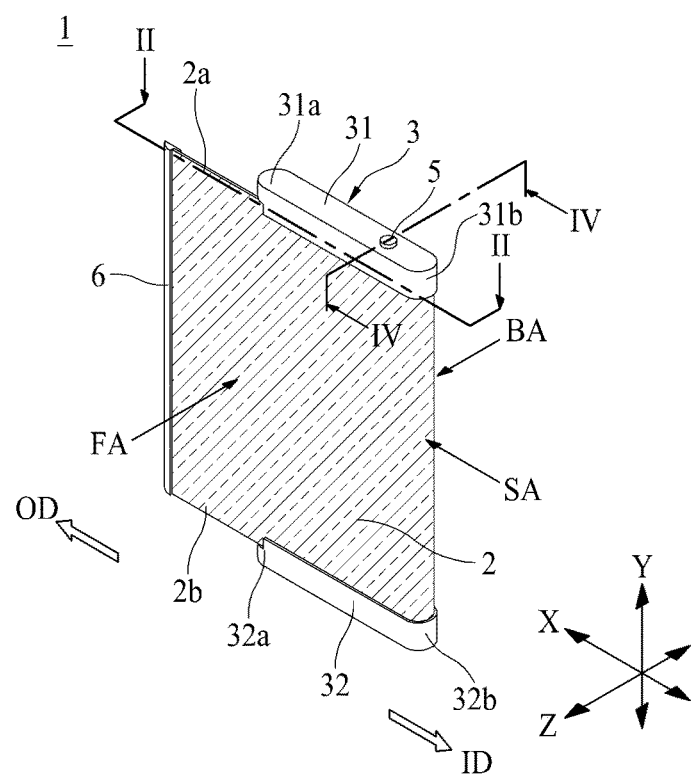
FIG. 1B is a schematic front perspective view illustrating an unloaded state of a flexible display apparatus according to an embodiment of the present disclosure.
Figure 1C:
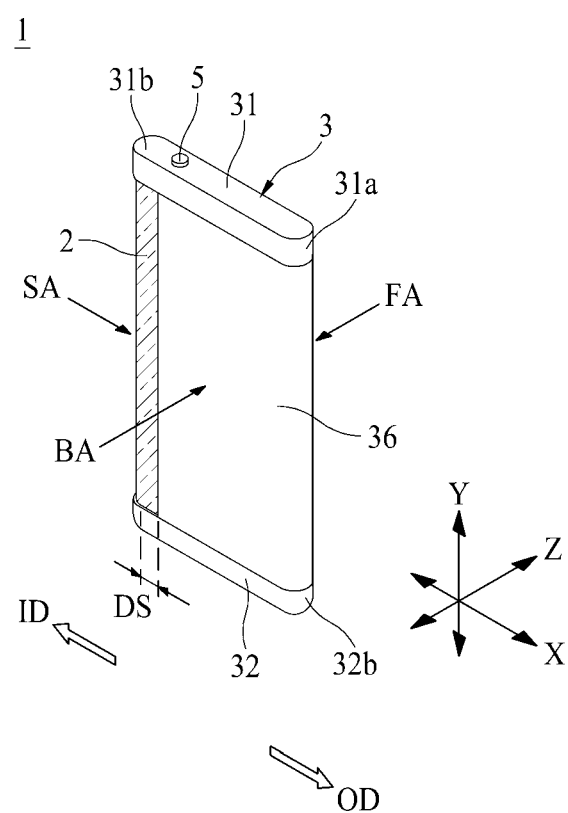
FIG. 1C is a schematic rear perspective view illustrating an inserted state of a flexible display apparatus according to an embodiment of the present disclosure.
Figure 2:
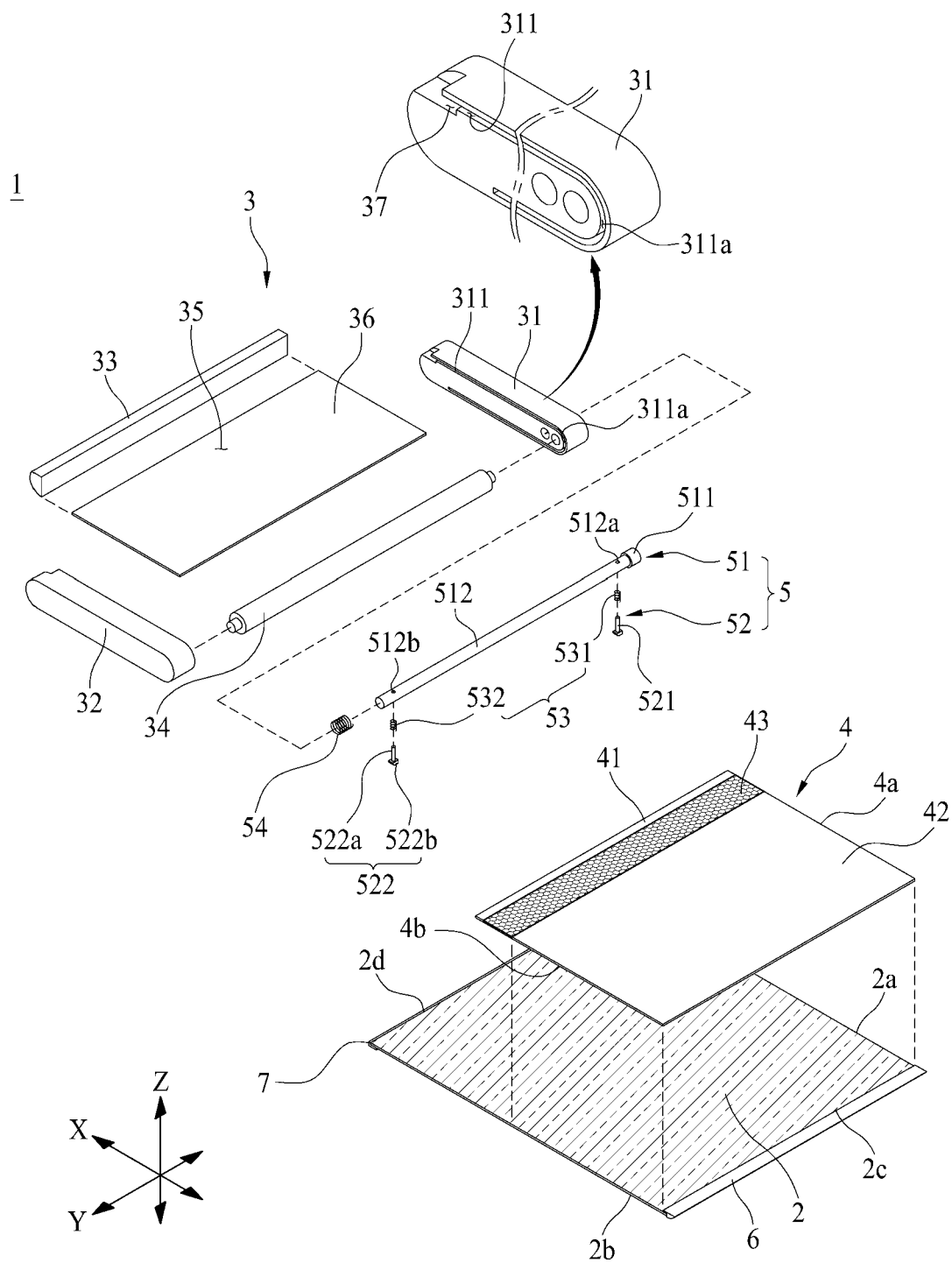
FIG. 2 is a schematic exploded perspective view of a flexible display apparatus according to an embodiment of the present disclosure.
Figure 3A:
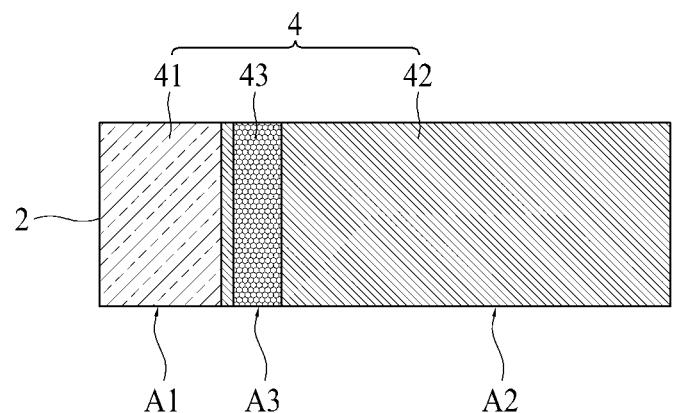
FIG. 3A is a schematic plan view of each of a display panel and a frame each illustrated in FIG. 2.
Figure 3B:
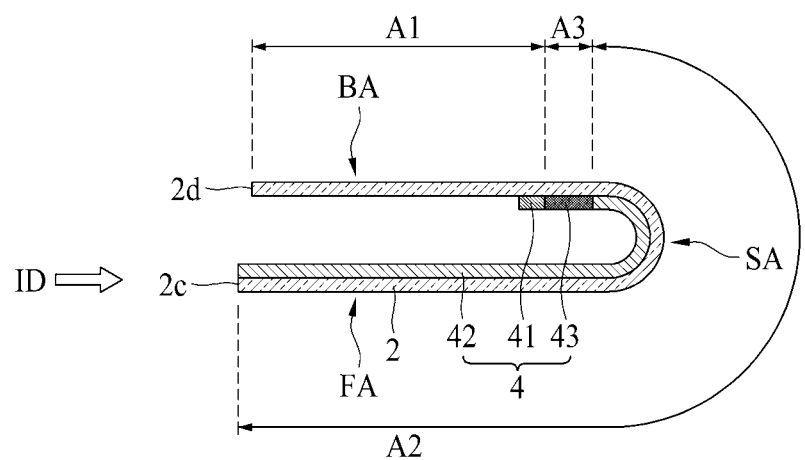
FIG. 3B is a schematic side view of each of a display panel and a frame each illustrated in FIG. 2 in an inserted state.
Figure 3C:
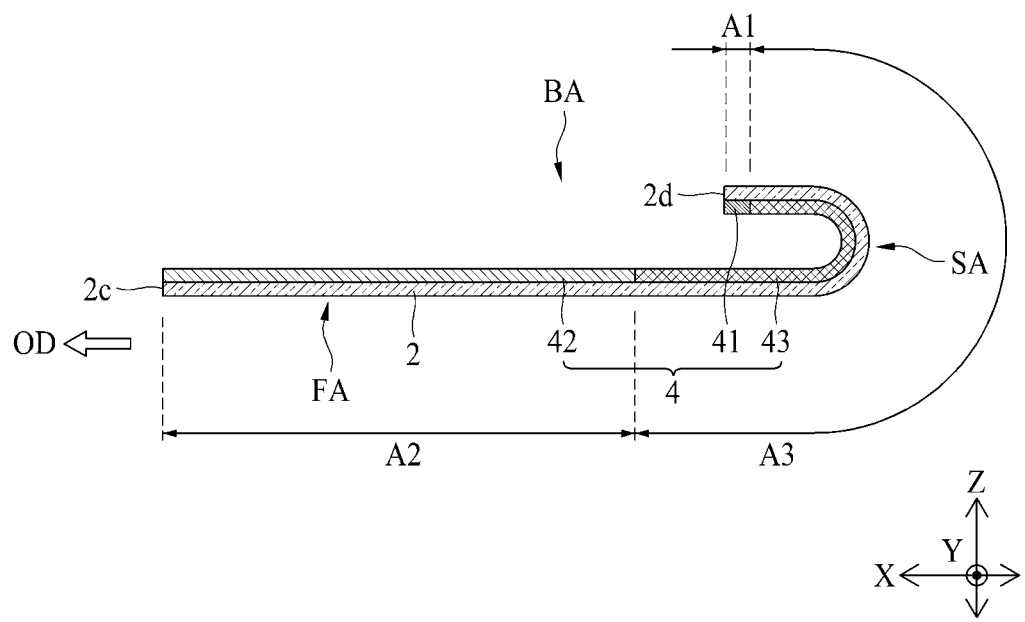
FIG. 3C is a schematic side view of each of a display panel and a frame each illustrated in FIG. 2 in an unloaded state.

FIG. 1A is a schematic front perspective view illustrating an inserted state of a flexible display apparatus 1 according to an embodiment of the present disclosure. FIG. 1B is a schematic front perspective view illustrating an unloaded state of the flexible display apparatus 1 according to an embodiment of the present disclosure. FIG. 1C is a schematic rear perspective view illustrating the inserted state of the flexible display apparatus 1 according to an embodiment of the present disclosure. FIG. 2 is a schematic exploded perspective view of the flexible display apparatus 1 according to an embodiment of the present disclosure. FIG. 3A is a schematic plan view of each of a display panel and a frame each illustrated in FIG. 2 and FIGS. 3B and 3C are schematic side views of the display panel and the frame in the inserted state and the unloaded state, respectively.

Referring to FIGS. 1A to 3C, the display apparatus 1 according to an embodiment of the present disclosure may include a display panel 2, a housing 3, and a frame 4. The frame 4 may include a first region or portion, which may be referred to herein as a "fixing part 41," a second region or portion, which may be referred to herein as a "sliding part 42," and a third region or portion, which may be referred to herein as an "elastic part 43."

The display panel 2 may be a display apparatus which displays an image. The display panel 2 may be a flexible display panel which is manufactured by using a material having flexibility like plastic so as to maintain display performance even when being bent like paper. The display panel 2 according to an embodiment may have a wholly tetragonal plate shape, but is not limited thereto and may have various shapes. The display panel 2 may include a first side 2a, a second side 2b, one side 2c, and the other side 2d.

Referring to FIG. 2, the first side 2a may be one side in a Y-axis direction and may denote an upper portion. The second side 2b may be the other side in the Y-axis direction and may denote a lower portion. For example, the Y-axis direction may be a direction parallel to a direction in which gravity is applied, but is not limited thereto. The one side 2c and the other side 2d may be located at opposite ends of the display panel 2 in a direction parallel to an X-axis direction perpendicular to the Y-axis direction. For example, the X-axis direction may be a direction in which the display panel 2 moves. A Z-axis direction may be a direction perpendicular to each of the X-axis direction and the Y-axis direction, and for example, a front region FA and a rear region BA may be located at opposite ends of the apparatus 1 in the Z-axis direction. Viewing the front region FA in the Z-axis direction, may enable a user to see a largest image displayed by the display panel 2. A side region SA may be disposed between the front region FA and the rear region BA. The display panel 2 may be disposed in each of the front region FA, the side region SA, and the rear region BA, and regions of the display panel 2 disposed in the front region FA, the side region SA, and the rear region BA may display different images.

The display panel 2 may be movably coupled to the housing 3. The display panel 2 according to an embodiment may be moved to enlarge a region of the display panel 2 disposed in the front region FA as illustrated in FIG. 1B, or may be moved to reduce the region of the display panel 2 disposed in the front region FA as illustrated in FIG. 1A. Hereinafter, a direction in which a region of the display panel 2 is enlarged may be referred to as an unloading direction (an OD arrow direction), and a direction in which the region of the display panel 2 is reduced may be referred to as an inserting direction (an ID arrow direction). Also, a state where the region of the display panel 2 disposed in the front region FA is enlarged based on movement of the display panel 2 in the unloading direction (the OD arrow direction) may be defined as an unloaded state, and a state where the region of the display panel 2 disposed in the front region FA is reduced based on movement of the display panel 2 in the inserting direction (the ID arrow direction) may be defined as an inserted state.

The display panel 2 may be moved based on manipulation by the user in the unloading direction (the OD arrow direction). For example, the user may grip or contact one side 2c of the display panel 2 with a hand and may move the display panel 2 in the unloading direction (the OD arrow direction). However, the present disclosure is not limited thereto, and the user may contact an arbitrary portion of the display panel 2 exposed at the front region FA and may move the display panel 2 in the unloading direction (the OD arrow direction). The one side 2c of the display panel 2 may denote an end portion of the display panel 2 in the unloading direction (the OD arrow direction) in the front region FA. In a state where a size of the display panel 2 is enlarged, the display panel 2 may be moved by the frame 4 in the inserting direction (the ID arrow direction).

The display panel 2, as illustrated in FIGS. 1A and 1B, may be provided in a bent state. Therefore, a direction in which the display panel 2 moves in the front region FA may be opposite to a direction in which the display panel 2 moves in the rear region BA. For example, when it is assumed that the one side 2c of the display panel 2 disposed in the front region FA moves in the unloading direction (the OD arrow direction) or the inserting direction (the ID arrow direction), the other side 2d of the display panel 2 disposed in the rear region BA may move in a direction opposite to the direction. In the present disclosure, with respect to the front region FA, a direction (i.e., an unloading direction) in which a screen is enlarged may be defined as the unloading direction (the OD arrow direction), and a direction (i.e., an inserting direction) in which the screen is reduced may be defined as the inserting direction (the ID arrow direction).

As the display panel 2 moves in the unloading direction (the OD arrow direction) or the inserting direction (the ID arrow direction), a portion of the display panel 2 covered by a below-described cover may be exposed at the outside, or an exposed portion may be covered by the cover. As the display panel 2 moves in the unloading direction (the OD arrow direction), a size of the display panel 2 exposed at the front region FA may increase, and thus, the user may see a wider-range image or a zoomed-in image compared to before a size increases.

The first side 2a and the second side 2b of the display panel 2 may be coupled to the housing 3. The first side 2a of the display panel 2 may denote an upper side portion of the display panel 2 in FIG. 1B. The second side 2b of the display panel 2 may denote a lower side portion of the display panel 2 in FIG. 1B. The first side 2a and the second side 2b of the display panel 2 may be movably coupled to the housing 3.

Figure 4A:
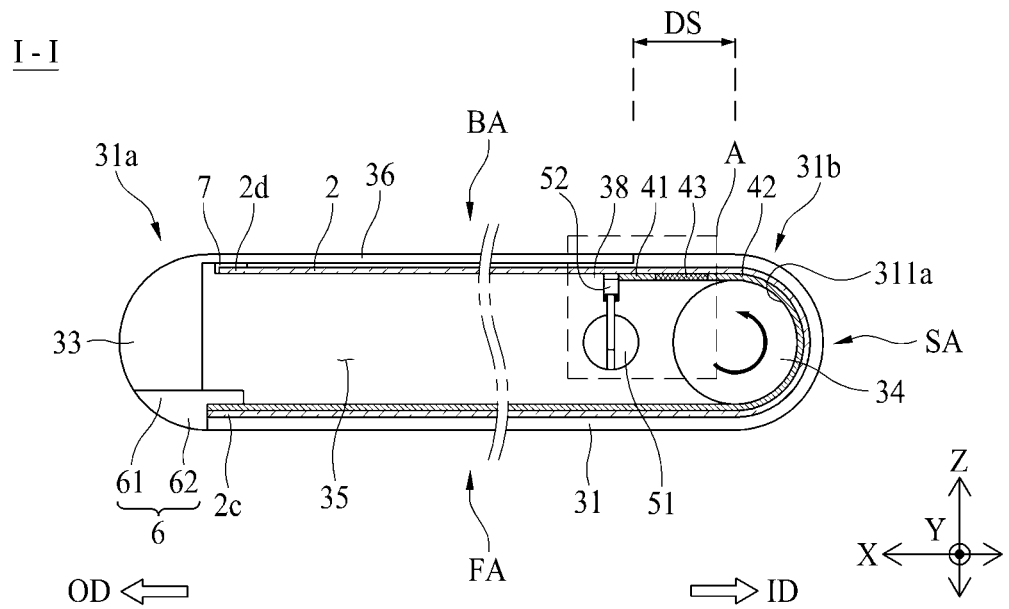
FIG. 4A is a schematic side view taken along line I-I illustrated in FIG. 1A in an inserted state.
Figure 4B:
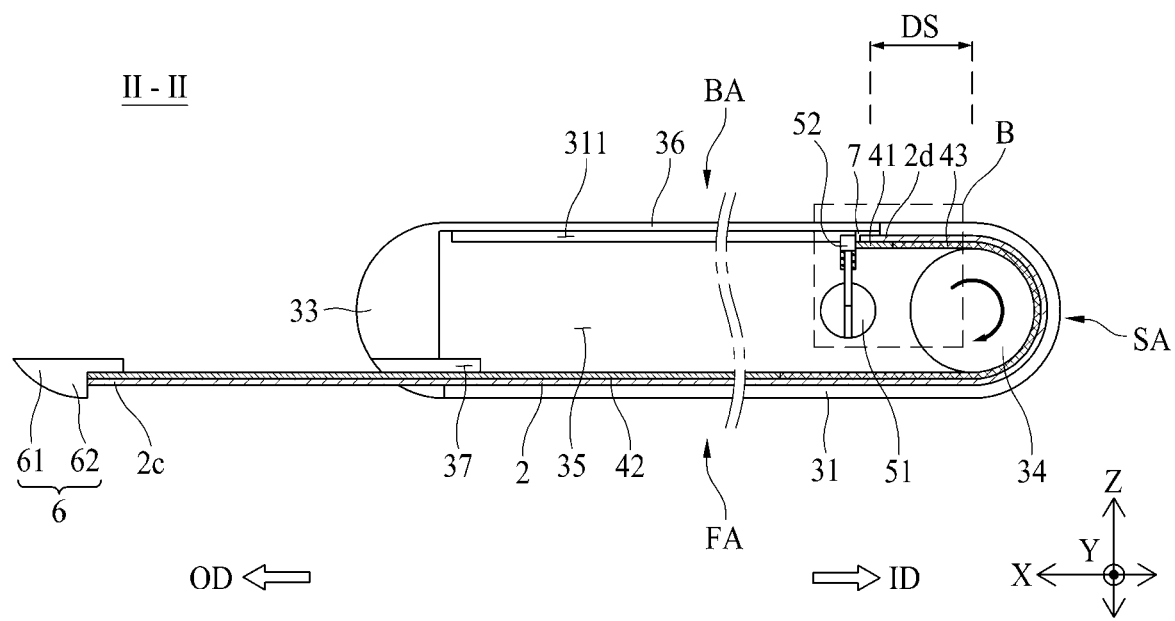
FIG. 4B is a schematic side view taken along line II-II illustrated in FIG. 1B in an unloaded state.

FIG. 4A is a schematic side view taken along line I-I illustrated in FIG. 1A in an inserted state, and FIG. 4B is a schematic side view taken along line II-II illustrated in FIG. 1B in an unloaded state.

Referring to FIGS. 1A to 4B, the display panel 2 may be movably coupled to the housing 3. The housing 3 may configure a wholly appearance of the flexible display apparatus 1 and may be provided in a tetragonal plate shape where an inner portion thereof is empty, but is not limited thereto. The housing 3 may include a first housing sidewall 31, a second housing sidewall 32, a third housing sidewall 33, and a guide roller, which may be referred to herein as a "guide roller part 34." The housing 3 may further include an accommodating groove 35, a cover 36, a coupling groove 37, and a stepped portion 38.

The first housing sidewall 31 may be a frame which is disposed in an upper side of the flexible display apparatus 1 as illustrated in FIGS. 1A to 4B. The first side 2a of the display panel 2 may be coupled to the first housing sidewall 31. The first housing sidewall 31 may be provided in a wholly long oval shape, but is not limited thereto and may be provided in another shape for supporting the first side 2a of the display panel 2. The first housing sidewall 31 may include one side 31a and the other side 31b.

In the inserted state, the one side 31a of the first housing sidewall 31 may be a portion where the one side 2c of the display panel 2 is disposed. The other side 31b of the first housing sidewall 31 may be a portion opposite to the one side 31a with respect to the display panel 2 disposed in the front region FA and may be a portion where the guide roller part 34 is disposed.

The first housing sidewall 31 may include a guide groove 311 for guiding the first side 2a of the display panel 2.

The guide groove 311 may be provided in an engraved form in the first housing sidewall 31 as illustrated in FIGS. 2 and 4B. Therefore, the first side 2a of the display panel 2 may be inserted into the guide groove 311. The display panel 2 inserted into the guide groove 311 may be moved along the guide groove 311 by a driving force provided by the user or the frame 4. The frame 4 coupled to the display panel 2 may be inserted into the guide groove 311 along with the display panel 2. Here, as illustrated in FIG. 4A, only the display panel 2 may be inserted into a portion of the guide groove 311 provided in the rear region BA in the inserted state, and the frame 4 may not be inserted thereinto. A below-described second coupling member may be inserted into a portion, into which the frame 4 is not inserted, of the guide groove 311 along with the display panel 2.

The guide groove 311 may be provided in a wholly laid U-shape in the first housing sidewall 31. In this case, one side of the guide groove 311 may communicate with the outside so that the one side 2c of the display panel 2 is unloaded from the one side 31a of the first housing sidewall 31 by a certain distance. The other side of the guide groove 311 may not communicate with the outside so that, when the display panel 2 is moving in the inserting direction (the ID arrow direction), the other side 2b of the display panel 2 is supported by the first housing sidewall 31 and thus does not move in the inserting direction (the ID arrow direction).

The guide groove 311 may further include a curve portion 311a, for bending the display panel 2. The curve portion 311a may be provided in the first housing sidewall 31 so as to be disposed in the other side 31b of the first housing sidewall 31. The curve portion 311a may be provided in a semicircular shape, and a radius thereof may be set to be equal to or slightly greater than a radius of the guide roller part 34 provided in a cylindrical shape. Therefore, the curve portion 311a may be provided to surround the guide roller part 34. Accordingly, the display panel 2 disposed in the curve portion 311a may be bent to surround the guide roller part 34.

The display apparatus 1 according to an embodiment of the present disclosure may be implemented so that the display panel 2 disposed in the curve portion 311a displays an image which differs from an image displayed by the display panel 2 disposed in a portion other than the curve portion 311a. For example, the display panel 2 disposed in the curve portion 311a may display simple information, such as letters of Kakaotalk or other messaging application, date, time, and another image. The curve portion 311a may be disposed in the side region SA, and thus, the display apparatus 1 may display the simple information on the side region SA. The display panel 2 disposed in the front region FA other than the curve portion 311a may display the simple information in more detail or may display a large-screen image such as a television (TV) or movie. Also, the display panel 2 disposed in the rear region BA other than the curve portion 311a may display another image such as an application or an icon.

Moreover, as a size of the below-described cover 36 decreases, a region of the display panel 2 capable of displaying an image on the rear region BA may relatively increase, and in this case, the display panel 2 disposed in the rear region BA may display an image which is the same as or different from an image displayed by the display panel 2 disposed in the front region FA.

Different regions of the display panel 2 may be disposed in the side region SA on the basis of the unloaded state or the inserted state of the display panel 2. The flexible display apparatus 1 according to an embodiment of the present disclosure may always display simple information regardless of the unloaded state or the inserted state of the display panel 2 disposed in the side region SA unlike the display panel 2 disposed in the front region FA or the rear region BA, thereby enabling the user to easily recognize the simple information through the side region SA.

The second housing sidewall 32 may be a frame disposed in a lower portion of the flexible display apparatus 1. The second housing sidewall 32 may be disposed in parallel with the first housing sidewall 31. The second housing sidewall 32 may be spaced apart from the first housing sidewall 31 by a certain distance. For example, the second housing sidewall 32 may be spaced apart from the first housing sidewall 31 by a length of the third housing sidewall 33. The second side 2b of the display panel 2 may be coupled to the second housing sidewall 32. The second housing sidewall 32 may be provided in the same shape as that of the first housing sidewall 31, and thus, the first side 2a and the second side 2b of the display panel 2 may be maintained in a flat state. The second housing sidewall 32 may include a guide groove for guiding the second side 2b of the display panel 2. The guide groove of the second housing sidewall 32 may further include a curve portion. The guide groove and the curve portion of the second housing sidewall 32 may be provided to be symmetrical with the guide groove 311 and the curve portion 311a of the first housing sidewall 31, and in this regard, there may be a difference therebetween. However, the second housing sidewall 32 and the first housing sidewall 31 may have the same function and effect. Therefore, a detailed description thereof will be omitted.

The second housing sidewall 32 may include one side 32a and the other side 32b. In the inserted state, the one side 32a of the second housing sidewall 32 may be a portion where the one side 2c of the display panel 2 is disposed. The other side 32b of the second housing sidewall 32 may be a portion opposite to the one side 32a with respect to the display panel 2 disposed in the front region FA and may be a portion where the guide roller part 34 is disposed.

The flexible display apparatus 1 according to an embodiment of the present disclosure may be implemented as a compact type in that the display panel 2 is folded in a bent state by using the curve portion 311a of the guide groove 321. Also, in the flexible display apparatus 1 according to an embodiment of the present disclosure, the first side 2a and the second side 2b of the display panel 2 may be respectively inserted into the guide groove of the first housing sidewall 31 and the guide groove of the second housing sidewall 32, and thus, the first housing sidewall 31 and the second housing sidewall 32 may support the display panel 2. Accordingly, even when the user touches the display panel 2, the flexible display apparatus 1 according to an embodiment of the present disclosure may prevent deformation such as the display panel 2 being bent.

The third housing sidewall 33 may be connected to the one side 31a of the first housing sidewall 31 and the one side 32a of the second housing sidewall 32. The third housing sidewall 33 according to an embodiment may couple the first housing sidewall 31 to the second housing sidewall 32. The third housing sidewall 33 may be coupled to each of the first housing sidewall 31 and the second housing sidewall 32 by using various coupling methods such as an adhesive coupling method, a fitting-coupling method, and a bolt-coupling method. The third housing sidewall 33 may have a long rod shape which is long in length, and for example, may include a cross-sectional surface having a fan shape. As illustrated in FIG. 4A, when the one side 2c of the display panel 2 is inserted into the housing 3, the third housing sidewall 33 may contact a below-described first coupling member.

Referring again to FIGS. 2 and 4A, the guide roller part 34 may be disposed in the other sides 31b and 32b of the first and second housing sidewalls 31 and 32. The guide roller part 34 according to an embodiment may be disposed between the first housing sidewall 31 and the second housing sidewall 32. The guide roller part 34 may contact an inner surface of the display panel 2. In more detail, the guide roller part 34 may contact a bending portion of the display panel 2 disposed in the curve portion 311a. Here, the inner surface of the display panel 2 may be a non-display area which does not display an image. Therefore, the guide roller part 34 may support the non-display area regardless of that the display panel 2 displays an image, and thus, the user may easily change the inserted state and the unloaded state even when an image is being displayed. Accordingly, the guide roller part 34 may support the bending portion of the display panel 2, thereby preventing deformation where the bending portion of the display panel 2 is recessed toward the accommodating groove 35 or is changed to a flat shape.

The guide roller part 34 may rotate based on moving of the display panel 2. The guide roller part 34 according to an embodiment may clockwise rotate when the one side 2c of the display panel 2 moves in the unloading direction (the OD arrow direction). The guide roller part 34 according to an embodiment may counterclockwise rotate when the one side 2c of the display panel 2 moves in the inserting direction (the ID arrow direction). On the other hand, the guide roller part 34 may counterclockwise rotate when the one side 2c of the display panel 2 moves in the unloading direction (the OD arrow direction) and may clockwise rotate when the one side 2c of the display panel 2 moves in the inserting direction (the ID arrow direction). Accordingly, in the display apparatus 1 according to an embodiment of the present disclosure, since the guide roller part 34 rotates along with moving of the display panel 2, the bending portion of the display panel 2 may be prevented from being deformed in shape, and moreover, friction occurring in the display panel 2 may decrease compared to a case where there is no rotation, thereby extending a lifetime of the display panel 2.

In the flexible display apparatus 1 according to an embodiment of the present disclosure, it has been described that the first housing sidewall 31, the second housing sidewall 32, the third housing sidewall 33, and the guide roller part 34 are separately manufactured and are coupled to the housing 3, but the present disclosure is not limited thereto. In other embodiments, unless the guide roller part 34 rotates, the first housing sidewall 31, the second housing sidewall 32, the third housing sidewall 33, and the guide roller part 34 may be provided as one body. When the housing 3 is provided as one body, a time taken in manufacturing a finished flexible display apparatus 1 may be shortened. Alternatively, the first housing sidewall 31, the second housing sidewall 32, and the third housing sidewall 33 other than the guide roller part 34 may be provided as one body and only the guide roller part 34 may be separately manufactured, and the first housing sidewall 31, the second housing sidewall 32, and the third housing sidewall 33 may be rotatably coupled to the guide roller part 34. The first housing sidewall 31, the second housing sidewall 32, and the third housing sidewall 33 may be provided to surround an edge of the display panel 2, thereby protecting the display panel 2 from an impact applied from the outside.

Referring to FIGS. 1A to 4B, the accommodating groove 35 may accommodate the frame 4 and a portion of the display panel 2. The accommodating groove 35 according to an embodiment may be a space surrounded by the first housing sidewall 31, the second housing sidewall 32, the third housing sidewall 33, and the guide roller part 34. A partial region of the display panel 2 may be disposed in each of the front region FA and the side region SA to cover the accommodating groove 35, and the other region, except the partial region, of the display panel 2 and the cover 36 may be disposed in the rear region BA. In this case, as the display panel 2 is bent by the housing 3, the display panel 2 may be disposed in the front region FA, the rear region BA, and the side region SA. Although not shown, a printed circuit board (PCB) including circuits for driving of the display panel 2, communication, and driving of a set and a battery for supplying power to the PCB may be accommodated into the accommodating groove 35. The PCB and the battery may be disposed in an inner portion of the display panel 2 disposed in the front region FA, the rear region BA, and the side region SA. That is, the PCB and the battery may be surrounded by the display panel 2. Therefore, the PCB and the battery may not interfere in movement of the display panel 2.

The cover 36 may cover the accommodating groove 35. The cover 36 according to an embodiment may be coupled to the housing 3 so as to be disposed in the rear region BA of the flexible display apparatus 1. The cover 36 may be releasably coupled to the first housing sidewall 31, the second housing sidewall 32, and the third housing sidewall 33 of the housing 3. The cover 36 may be provided in a wholly tetragonal plate shape, but is not limited thereto and may be provided in another shape which is coupled to the housing 3 to cover the accommodating groove 35. The cover 36 may be formed of the same material as that of the housing 3 to enhance a sense of unity and a sense of beauty, but is not limited thereto and may be formed of another material. The cover 36 may be formed of a plastic material for weight-lightness. A surface, exposed to the outside, of the cover 36 may be provided to have various patterns such as a concave-convex pattern for preventing sliding of the user's hand.

The cover 36 may be provided to have a size smaller than that of the accommodating groove 35 in the X-axis direction as illustrated in FIGS. 1C, 2, and 4A. Therefore, a separation space DS may be provided between the cover 36 and the guide roller part 34. In more detail, the separation space DS may be provided between the cover 36 and a rotational shaft of the guide roller part 34. The flexible display apparatus 1 may be implemented so that the display panel 2 is bent with respect to the guide roller part 34, and thus, a portion thereof may be disposed in the front region FA and the other portion thereof may be disposed in the rear region BA. Accordingly, the other portion of the display panel 2 disposed in the separation space DS may cover the accommodating groove 35 so that the accommodating groove 35 is not exposed at the outside.

The display panel 2 disposed in the separation space DS may display an image. The flexible display apparatus 1 according to an embodiment of the present disclosure may be implemented so that the front region FA, the side region SA, and the rear region BA of the display panel 2 display different images, and thus, the user may quickly recognize various information from different images displayed at different positions, thereby enhancing convenience of the user for acquiring information.

Referring to FIGS. 2 to 4B, the frame 4 may be movably disposed in the housing 3 and may stretch and contract based on movement of the display panel 2. One side of the frame 4 may be coupled to the housing 3, and the frame 4 may move the display panel 2 coupled to the other side. The frame 4 may be provided in a wholly tetragonal plate shape, and thus, may be coupled to the display panel 2 to overlap the display panel 2. The frame 4 may be formed of a metal material such as stainless steel or aluminum, but is not limited thereto and may be formed of another material which enables the frame 4 to be coupled to the housing 3 and the display panel 2 and to stretch and contract. For example, the frame 4 may be a metal sheet which is thin in thickness. The frame 4 may include a first side 4a, a second side 4b, a fixing part 41, a sliding part 42, and an elastic part 43.

The first side 4a of the frame 4 may denote a portion which is coupled to the first side 2a of the display panel 2, and the second side 4b of the frame 4 may denote a portion which is coupled to the second side 2b of the display panel 2. That is, the first side 4a of the frame 4 may be an upper portion with respect to the Y-axis direction, and the second side 4b may be a lower portion with respect to the Y-axis direction. As the first side 2a of the display panel 2 is inserted into the first housing sidewall 31, an edge of the first side 4a of the frame 4 may be supported by the first housing sidewall 31. Likewise, the second housing sidewall 32 may support an edge of the second side 4b of the frame 4.

The fixing part 41 may be fixed to the housing 3 and may movably support a first region A1 (illustrated in FIGS. 3A-3C) of the display panel 2.

Referring to FIGS. 3A to 3C, to describe a region of the display panel 2 in detail, the display panel 2 may include a first region A1, a second region A2, and a third region A3. Also, the second region A2 may be a region corresponding to the sliding part 42 of the frame 4, and the third region A3 may be a region corresponding to the elastic part 43 of the frame 4. The frame 4 of FIG. 3B may be in an unstretched state (i.e., a state of the frame 4 which is in the inserted state). When the frame 4 is coupled to the display panel 2 to match an end of the one side 2c of the display panel 2, the first region A1 may be disposed on the fixing part 41 with respect to the Z-axis direction. Likewise, the second region A2 may be disposed on the sliding part 42, and the third region A3 may be disposed on the elastic part 43. As illustrated in FIG. 3B, in the inserted state, the frame 4 may have a length which is shorter than that of the display panel 2, and thus, may overlap only a portion of the display panel 2.

With respect to FIG. 3B, the second region A2 may be fixedly coupled to the sliding part 42. For example, the second region A2 of the display panel 2 may be coupled to the sliding part 42 by using various coupling methods such as the adhesive coupling method, the fitting-coupling method, and the bolt-coupling method. Accordingly, the sliding part 4 may move along with the display panel 2.

The third region A3 and the first region A1 of the display panel 2 may not be fixed to the frame 4. Referring to FIG. 4A, in the inserted state, the first region A1 and the third region A3 may be disposed in the rear region BA. The second region A2 may be disposed in the front region FA, the side region SA, and the rear region BA in the inserted state, but is not limited thereto and may be disposed in only the front region FA or the front region FA and the side region SA. At least one of the first region A1, the second region A2, and the third region A3 of the display panel 2 may display different images. For example, the second region A2 disposed in the front region FA, the third region A3 disposed in the side region SA, and the first region A1 disposed in the rear region BA may display different images. When a portion of each of the second region A2 and the third region A3 is disposed in the front region FA in the unloaded state as illustrated in FIGS. 3C and 4B, the portion of the second region A2 and the portion of the third region A3 may display the same image. In this case, the other portion of the third region A3 disposed in the side region SA may display an image representing simple information, and the other portion of the third region A3 disposed in the rear region BA and the first region A1 disposed in the rear region BA may display images which differ from images displayed on the front region FA and the side region SA. Here, the same image may denote that the same image output signal is received from the PCB. As a result, the display panel 2 disposed in the front region FA, the display panel 2 disposed in the side region SA, and the display panel 2 disposed in the rear region BA may display different images.

Referring to FIG. 3C, the frame 4 may have the same length as that of the display panel 2 in the unloaded state, and thus, may wholly overlap the display panel 2. Here, the fixing part 41 may be fixed to the housing 3 and the sliding part 42 may be fixed to the display panel 2, and thus, as the one side 2c of the display panel 2 is unloaded to the outside by an action of the user's hand, the elastic part 43 may stretch. Since the sliding part 42 is in a state coupled to the display panel 2, a size of the second region A2 may not be changed, a size of the third region A3 corresponding to the elastic part 43 of the frame 4 uncoupled to the display panel 2 may increase, and a size of the first region A1 may decrease. As a result, in the flexible display apparatus 1 according to an embodiment of the present disclosure, a length of the frame 4 overlapping the display panel 2 may vary based on the inserted state and the unloaded state. That is, a length of the display panel 2 supported by each of the fixing part 41 and the elastic part 43 except the sliding part 42 may vary. In the flexible display apparatus 1 according to an embodiment of the present disclosure, when the inserted state is changed to the unloaded state, a length of the display panel 2 and a length of the frame 4 may become equal based on manipulation by the user, and when the unloaded state is changed to the inserted state, as the elastic part 43 contract based on an elastic restoring force, a length of the frame 4 may become shorter than that of the display panel 2. Accordingly, in the display apparatus according to an embodiment of the present disclosure, the display panel 2 may be enlarged and reduced with only an action of a user's hand by using an action of the user's hand or the elastic part 43 without a separate driving power, and thus, total size and weight may decrease, thereby increasing the convenience of keeping and movement.

Referring again to FIGS. 2 to 4B, the fixing part 41 may be provided in a wholly long rod shape in the Y-axis direction. The fixing part 41 may be disposed closer to the other side 2d of the display panel 2 than the sliding part 42. Both ends of the fixing part 41 may be supported by the first housing sidewall 31 and the second housing sidewall 32. Although not shown, the both ends of the fixing part 41 may be respectively coupled to the first housing sidewall 31 and the second housing sidewall 32 by using various coupling methods such as the adhesive coupling method, the fitting-coupling method, and the bolt-coupling method. Accordingly, since the fixing part 41 is supported by and fixed to the first housing sidewall 31 and the second housing sidewall 32, the sliding part 42 may move in the unloading direction (the OD arrow direction), and thus, the elastic part 43 may stretch.

The sliding part 42 may be coupled to the second region A2 of the display panel 2 and may be movably disposed in the housing 3. The sliding part 42 may be provided in a wholly tetragonal plate shape and may be coupled to the display panel 2 to match an end of the one side 2c of the display panel 2. Therefore, the sliding part 42 may overlap the whole second region A2 and may support the whole second region A2 of the display panel 2. The sliding part 42 may be inserted into the guide groove provided in each of the first housing sidewall 31 and the second housing sidewall 32 and may move along with the display panel 2, but is not limited thereto. In other embodiments, the sliding part 42 may contact the first housing sidewall 31 and the second housing sidewall 32 without being inserted into the first housing sidewall 31 and the second housing sidewall 32 and may move along with the display panel 2. When the sliding part 42 is inserted into the guide groove, each of the first housing sidewall 31 and the second housing sidewall 32 may apply a larger supporting force to the sliding part 42, thereby preventing deformation such as the display panel 2 being crumpled and further maintaining flatness of the display panel 2 in the unloaded state.

The elastic part 43 may be connected between the fixing part 41 and the sliding part 42 and may elastically support the third region A3 of the display panel 2. The elastic part 43 may be provided between the fixing part 41 and the sliding part 42 to overlap a whole region between the first side 2a and the second side 2b of the display panel 2. The elastic part 43 may be formed of a metal sheet such as stainless steel or aluminum to have a fine pattern through photo etching, but is not limited thereto and may be formed to have the fine pattern through another process. The fine pattern may be provided in a honeycomb shape to have a plate spring function, but is not limited thereto and may be provided in another shape which enables the elastic part 43 to stretch and contract.

As the one side 2c of the display panel 2 moves the unloading direction (the OD arrow direction) on the basis of an action of the user's hand, the elastic part 43 may stretch. The elastic part 43 may contract based on the elastic restoring force and may move the one side 2c of the display panel 2 in the inserting direction (the ID arrow direction). Based on the inserted state and the unloaded state, a length of the display panel 2 supported by the elastic part 43 may vary. As illustrated in FIGS. 3B and 3C, a length of the display panel 2 supported by the elastic part 43 may be longer in the unloaded state than the inserted state.

Referring to FIGS. 4A and 4B, when the display panel 2 slides, the guide roller part 34 may support the third region A3 of the display panel 2. The guide roller part 34 may support the elastic part 43 of the frame 4 in the unloaded state, and thus, may indirectly support the third region A3 of the display panel 2. The guide roller part 34 may support the sliding part 42 of the frame 4 in the inserted state, and thus, may indirectly support the second region A2 of the display panel 2. As a result, the frame 4 may contract along the guide roller part 34. Accordingly, the guide roller part 34 may support the frame 4, thereby preventing deformation such as the region of the display panel 2 being crumpled in the unloaded state, the inserted state, or switch between the unloaded state and the inserted state.

Figure 5A:
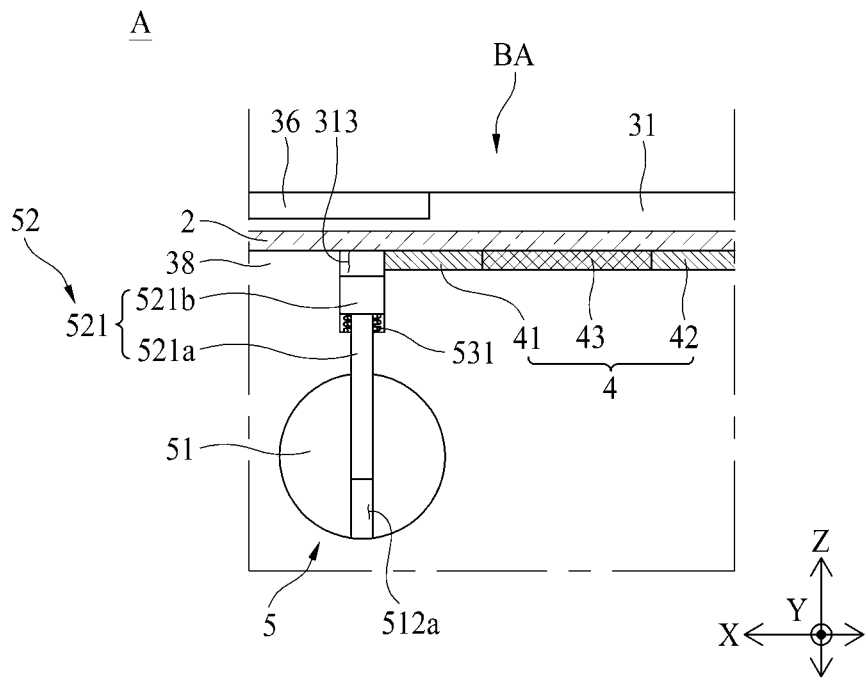
FIG. 5A is a schematic enlarged view of a portion A illustrated in FIG. 4A.
Figure 5B:
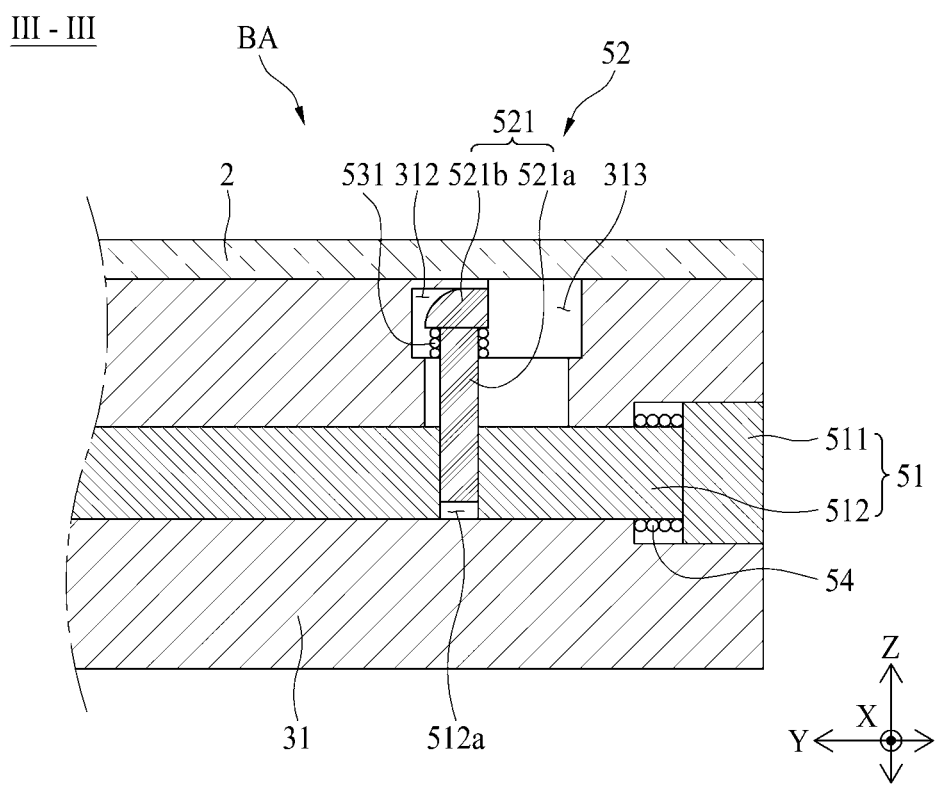
FIG. 5B is a schematic side cross-sectional view taken along line III-III illustrated in FIG. 1A.
Figure 6A:
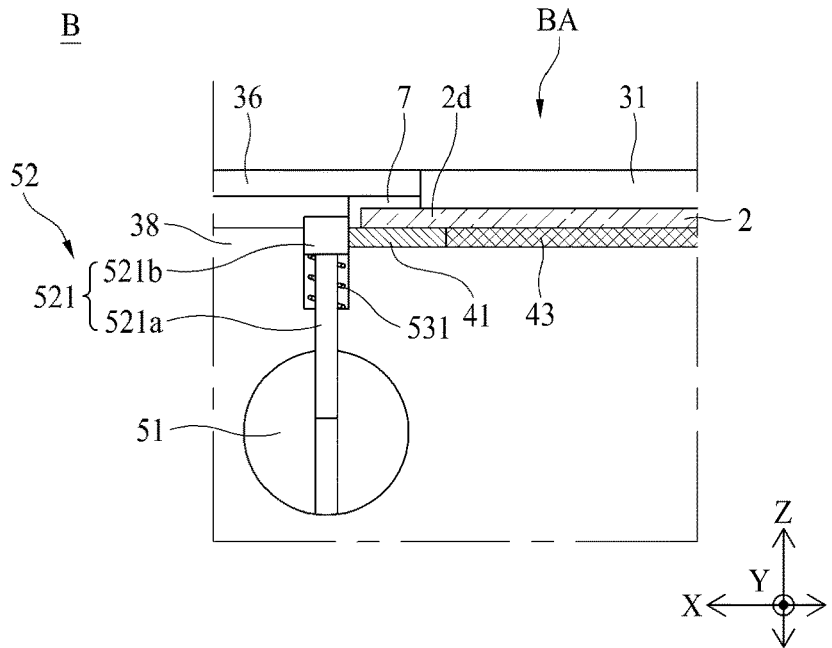
FIG. 6A is a schematic enlarged view of a portion B illustrated in FIG. 4B.
Figure 6B:
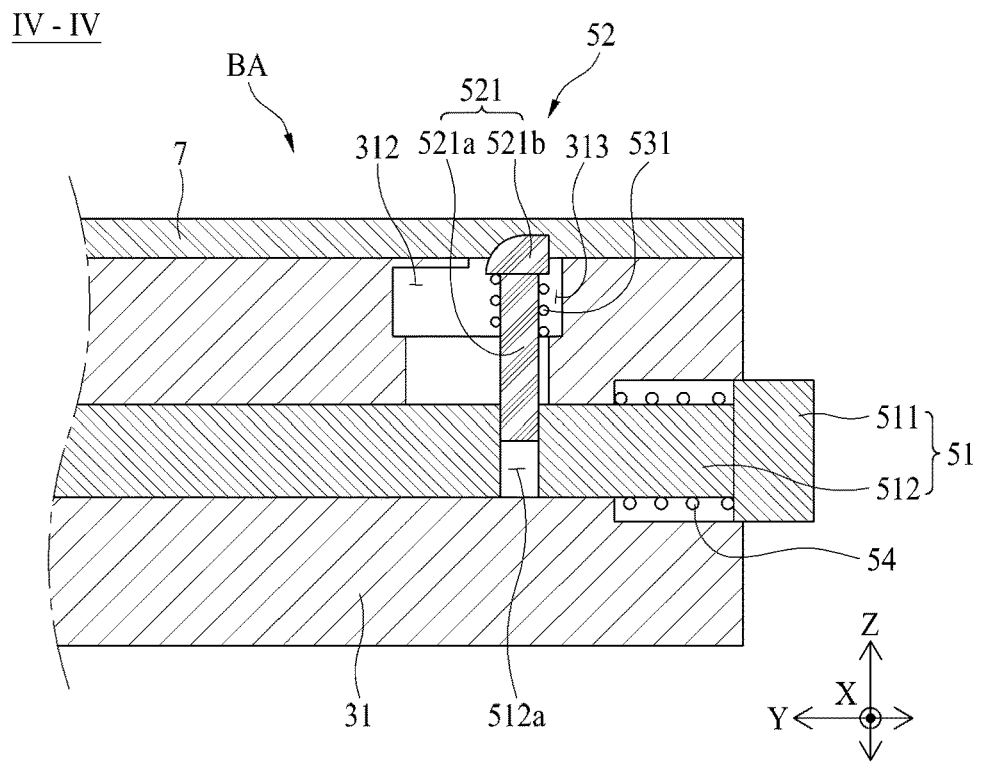
FIG. 6B is a schematic side cross-sectional view taken along line IV-IV illustrated in FIG. 1B.
Figure 7:
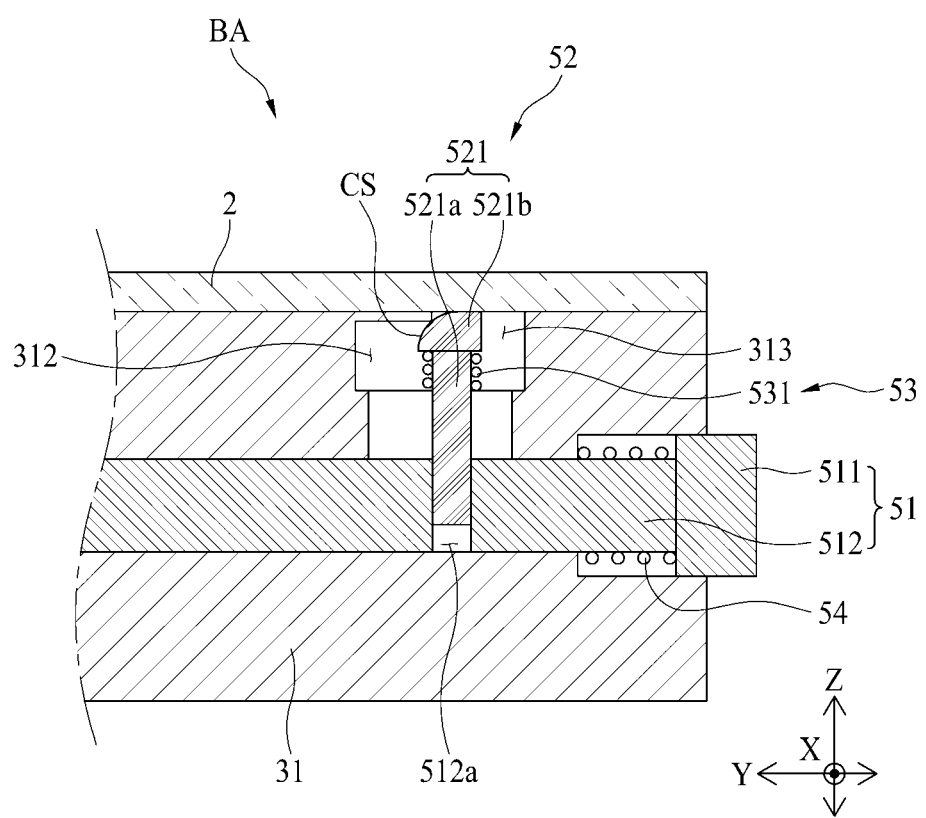
FIG. 7 is a schematic enlarged view of a stopper part illustrated in FIG. 5B in a normal state.

FIG. 5A is a schematic enlarged view of a portion A illustrated in FIG. 4A, and FIG. 5B is a schematic side cross-sectional view taken along line III-III illustrated in FIG. 1A. FIG. 6A is a schematic enlarged view of a portion B illustrated in FIG. 4B, and FIG. 6B is a schematic side cross-sectional view taken along line IV-IV illustrated in FIG. 1B. FIG. 7 is a schematic enlarged view of a stopper, which may be referred to herein as a "stopper part," as illustrated in FIG. 5B in a normal state.

Referring to FIGS. 2 and 4A to 7, the flexible display apparatus 1 according to an embodiment of the present disclosure may further include a stopper part 5.

The stopper part 5 may be installed in the housing 3 and may restrain sliding of the display panel 2. In more detail, the stopper part 5 may be installed to extend from the first housing sidewall 31 to the second housing sidewall 32. Therefore, the stopper part 5 may support the first side 2a and the second side 2b of the display panel 2. When a portion of the second region A2 of the display panel 2 is slid to the outside of the housing 3, the stopper 5 may restrain sliding of the display panel 2. For example, when the one side 2c of the display panel 2 is unloaded in the unloading direction (the OD arrow direction) by an action of the user's hand, the stopper part 5 may support the other side 2d of the display panel 2 to restrain sliding of the display panel 2. Therefore, movement of the first side 2a portion and the second side 2b portion (i.e., an upper portion and a lower portion) of the other side 2d of the display panel 2 may be limited by the stopper part 5 in the unloaded state, and thus, the one side 2c of the display panel 2 may maintain a state unloaded from the housing 3 (i.e., a screen-enlarged state). As a result, the stopper part 5 may limit movement of the display panel 2, and thus, a length of the frame 4 may be the same as that of display panel 2 as described above. Also, the stopper part 5 may release limitation of movement of the display panel 2, and thus, the frame 4 may contract based on the elastic restoring force, whereby a length of the frame 4 may be shorter than that of display panel 2. The stopper part 5 may perform a button function of maintaining and releasing the unloaded state of the flexible display apparatus 1. The stopper part 5 may include an elevation part 51, which may include a substantially cylindrical body, a movement part 52, which may include a plurality of substantially cylindrical bodies, a first elastic member, which may be referred to herein as a "first elastic part 53," and a second elastic member, which may be referred to herein as a "second elastic part 54."

The elevation part 51 may be installed in the housing 3 so as to be raised or lowered in a first axial direction. The first axial direction may be the Y-axis direction and may be a direction parallel to a direction in which gravity is applied, but is not limited thereto. When the first axial direction is a direction parallel to a gravity direction, the elevation part 51 may move upward and downward. The elevation part 51 may be provided in a cylindrical shape where a length is wholly long, but is not limited thereto. When the display panel 2 is changed to the unloaded state by manipulation by the user, the elevation part 51 may move in an upward direction to restrain sliding of the display panel 2. The elevation part 51 may move in a downward direction on the basis of manipulation by the user and may release restraint of sliding of the display panel 2, and thus, the elastic part 43 may contract based on the elastic restoring force and may change the display panel 2 to the inserted state. The elevation part 51 may include a button member 511 and a connection member 512.

The button member 511 may correspond to a button protruding from the flexible display apparatus 1 to the outside as illustrated in FIG. 1A. The button member 511 may be movably coupled to the first housing sidewall 31 and may move in the first axial direction on the basis of manipulation by the user or stretching and contracting of the frame 4. The button member 511 may be provided in order for a portion thereof to protrude from the first housing sidewall 31 so that the user easily manipulate the button member 511, but is not limited thereto and may be provided in a structure which does not protrude from the first housing sidewall 31, for providing a sense of unity with the first housing sidewall 31.

The second elastic part 54 may be coupled to the button member 511. One side of the second elastic part 54 may be coupled to the first housing sidewall 31, and the other side may be coupled to a lower surface of the button member 511. The second elastic part 54 may solve a problem where the button member 511 is inserted into the first housing sidewall 311 and does not protrude to the outside of the first housing sidewall 31. In more detail, the second elastic part 54 may move the button member 511, moved to a lower side by manipulation by the user, to an upper side. The second elastic part 54 may move the button member 511 in an upward direction (i.e., a direction protruding from the housing 3), based on as a second elastic restoring force. The second elastic part 54 may be a spring, but is not limited thereto and may be a means capable of being moved based on the elastic restoring force.

The connection member 512 may be coupled to the lower surface of the button member 511. Therefore, the connection member 512 may move along with the button member 511, based on movement of the button member 511. The connection member 512 may be movably coupled to the first housing sidewall 31 and the second housing sidewall 32. The connection member 512 may be inserted into a through hole or a groove each provided in each of the first housing sidewall 31 and the second housing sidewall 32. The connection member 512 may long extend from the first housing sidewall 31 to the second housing sidewall 32 to move the movement part 52. The connection member 512 may be provided in a cylindrical shape where a length is wholly long, but is not limited thereto and may be provided in another shape which enables the connection member 512 to be movably coupled to the first housing sidewall 31 and the second housing sidewall 32 and to move the movement part 52.

The movement part 52 may be disposed in the housing 3 so as to move in a second axial direction on the basis of movement of the connection member 512. The second axial direction may be the Z-axis direction and may be a direction toward the front region FA and the rear region BA. The movement part 52, as illustrated in FIGS. 2 and 4A to 7, may be movably coupled to the connection member 512, may move to the front region FA and the rear region BA on the basis of movement of the connection member 512, and may support or not support the other side 2d of the display panel 2. The movement part 52 may include a first movement part 521, which may include a substantially cylindrical body, and a second movement part 522, which may include a substantially cylindrical body.

The first movement part 521, as illustrated in FIG. 2, may be inserted into a first through hole 512a provided in an upper portion of the connection member 512 and may move to the front region FA or the rear region BA. In more detail, as illustrated in FIGS. 5A and 5B, the first movement part 521 may include a first inserting member 521a and a first supporting member 521b coupled to the first inserting member 521a.

The first inserting member 521a may be provided in a cylindrical shape where a length is long. The first inserting member 521a may be movably inserted into the first through hole 512a. The first supporting member 521b may be provided to have a size which is greater than a diameter of the first inserting member 521a, may move to the front region FA or the rear region BA, and may support or not support the other side 2d of the display panel 2 or a below-described second coupling member.

In a case where the first supporting member 521b is inserted into the first support inserting groove 312 provided in the first housing sidewall 31 with reference to FIG. 5B, the first supporting member 521b may move to the front region FA, and in a case where the first supporting member 521b moves to a first support protrusion groove 313 provided to communicate with the first support inserting groove 312 with reference to FIG. 6B and FIG. 7, the first supporting member 521b may protrude from the first housing sidewall 31 and may move to the rear region BA. The first support inserting groove 312 may be provided to have a size greater than that of the first supporting member 521b so that, when the first supporting member 521b moves to a lower side, the first supporting member 521b is inserted into the first support inserting groove 312. The first support protrusion groove 313 may be provided to pass through the first housing sidewall 31 toward the rear region BA.

The first supporting member 521b may include a curve surface CS (illustrated in FIG. 7). The first supporting member 521b may be provided in a shape where a cross-sectional surface in the X-axis direction has a fan shape. The curve surface CS may contact the first housing sidewall 31 configuring the first support inserting groove 312. The curve surface CS may be provided to have a thickness which is progressively thickened in a direction from a lower side to an upper side with respect to the Y-axis direction. Therefore, when the first supporting member 521b is moved downward, the curve surface CS may be guided by the first housing sidewall 31 configuring the first support inserting groove 312 and may be easily inserted into the first support inserting groove 312. Likewise, due to the curve surface CS, the first supporting member 521b may easily move to the first support protrusion groove 313.

The first elastic member 531 of the first elastic part 53 may be elastically coupled to an outer circumference surface of the first inserting member 521a.

The first elastic member 531 may be provided to have a size which is greater than a diameter of the first inserting member 521a, and thus, one side of the first elastic member 531 may be coupled to the first housing sidewall 31 and the other side may be coupled to the first supporting member 521b. When changed to the inserted state, the first elastic member 531 may contract based on manipulation by the user and may stretch based on the elastic restoring force. In more detail, when the first supporting member 521b is inserted into the first housing sidewall 31 in a process of changing the unloaded state to the inserted state, the first elastic member 531 may contract, and then, when changed to the unloaded state, the first elastic member 531 may stretch based on the elastic restoring force and may allow the first supporting member 521b to protrude from the first housing sidewall 31 and thus may move the first supporting member 521b to the front region FA.

The second movement part 522, as illustrated in FIG. 2, may be inserted into a second through hole 512b provided in a lower portion of the connection member 512 and may move to the front region FA or the rear region BA. In more detail, the second movement part 522 may include a second inserting member 522a and a second supporting member 522b coupled to the second inserting member 522a. Except for that the second inserting member 522a and the second supporting member 522b are provided on the second housing sidewall 32, the second inserting member 522a and the second supporting member 522b are the same as the above-described first inserting member 521a and first supporting member 521b, and thus, the drawings illustrating operations of the first inserting member 521a and first supporting member 521b each illustrated in FIGS. 5A to 7 may be applied to the drawings illustrating operations of the second inserting member 522a and the second supporting member 522b.

The second inserting member 522a may be provided in a cylindrical shape where a length is long, with reference to FIG. 2. The second inserting member 522a may be movably inserted into the second through hole 512b. The second supporting member 522b may be provided to have a size which is greater than a diameter of the second inserting member 522a, may move to the front region FA or the rear region BA, and may support or not support a lower portion of the other side 2d of the display panel 2. The second supporting member 522b may move in the same direction along with the first supporting member 521b. When the second supporting member 522b is inserted into the second housing sidewall 32, the second supporting member 522b may move to the rear region BA, and when the second supporting member 522b protrudes from the second housing sidewall 32, the second supporting member 522b may move to the front region FA. The second supporting member 522b may include the same curve surface as that of the first supporting member 521b. The second elastic member 532 of the first elastic part 53 may be elastically coupled to an outer circumference surface of the second inserting member 522a.

The second elastic member 532 may be provided to have a size which is greater than a diameter of the second inserting member 522a, and thus, one side of the second elastic member 532 may be coupled to the second housing sidewall 32 and the other side may be coupled to the second supporting member 522b. Like when the second supporting member 522b is inserted into the second housing sidewall 32 in a process of changing the unloaded state to the inserted state, the second elastic member 532 may contract, and then, when changed to the unloaded state, the second elastic member 532 may stretch based on the elastic restoring force and may allow the second supporting member 522b to protrude from the second housing sidewall 32 and thus may move the second supporting member 522b to the front region FA.

In the flexible display apparatus 1 according to an embodiment of the present disclosure, a first elastic restoring force of the first elastic part 53 may be set to be greater than the second elastic restoring force of the second elastic part 54. The first elastic restoring force may be a sum of an elastic restoring force of the first elastic member 531 and a second elastic restoring force of the second elastic member 532. In FIG. 7, only the first elastic member 531 is illustrated for example. Referring to FIG. 7, when the first elastic restoring force of the first elastic part 53 is greater than the second elastic restoring force of the second elastic part 54, a force which moves the first supporting member 521b to the rear region BA may be stronger than a force which inserts the button member 511 into the first housing sidewall 31. Therefore, due to the curve surface CS provided in the first supporting member 521b, the first supporting member 521b may move to an upper side, and thus, a portion of the first supporting member 521b may move to the first support protrusion groove 313 to pressurize the display panel 2 to the rear region BA. Such a state may be a normal state of the flexible display apparatus 1 and may be a standby mode state before the inserted state is changed to the unloaded state. When the display panel 2 moves in the unloading direction (the OD arrow direction) on the basis of an action of the user's hand and thus an end of the other side 2d of the display panel 2 or the second coupling member passes through the first supporting member 521b, the first supporting member 521b having the standby mode state may protrude to the rear region BA on the basis of the first elastic restoring force and may support the end of the other side 2d of the display panel 2 or the second coupling member.

Therefore, in the flexible display apparatus 1 according to an embodiment of the present disclosure, the user may move the display panel 2 in the unloading direction (the OD arrow direction) with one hand to maintain the display panel 2 in the unloaded state, and thus, all of two hands may not be used in a process of changing the inserted state to the unloaded state, thereby enhancing convenience of the user.

Referring to FIGS. 2, 4A, 4B, and 6A, the flexible display apparatus 1 according to an embodiment of the present disclosure may further include a first coupling member 6 and a second coupling member 7.

The first coupling member 6 may be disposed between the first side 2a and the second side 2b of the display panel 2 and may be coupled to the one side 2c of the display panel 2. The first coupling member 6 according to an embodiment may be provided in a rod shape where a cross-sectional surface is provided in an arrowhead shape. The first coupling member 6 may be formed of a metal material, but is not limited thereto and may be formed of a plastic material for weight-lightness. The first coupling member 6 may be closely coupled to the display panel 2 from the one side 2c to the first and second sides 2a and 2b of the display panel 2, and thus, even when the one side 2c of the display panel 2 is unloaded from the housing 3, flatness of the display panel 2 may be maintained. The first coupling member 6 may include a flat member 61 and a protrusion member 62 with reference to FIG. 4A.

The flat member 61 may be inserted into the housing 3 when the display panel 2 is changed from the unloaded state to the inserted state. The flat member 61 according to an embodiment may be provided in a rod shape where a cross-sectional surface is tetragonal. The flat member 61 may be coupled to the one side 2c of the display panel 2. For example, the flat member 61 may be coupled to the display panel 2 in a lengthwise direction of each of the first side 2a and the second side 2b of the display panel 2 by using various coupling methods such as the adhesive coupling method and the fitting-coupling method. The flat member 61 may be inserted into a coupling groove 37 provided in the housing 3. The coupling groove 37 may be provided in an engraved form in the first housing sidewall 31 and may communicate with the guide groove 311. Therefore, when the unloaded state is changed to the inserted state, the flat member 61 may move in the inserting direction (the ID arrow direction) along with the display panel 2 and may be inserted into the coupling groove 37. As the flat member 61 is inserted into the coupling groove 37, the one side 2c of the display panel 2 may be disposed inside the housing 3.

The coupling groove 37, as illustrated in FIG. 4B, may be provided just on a position, at which the third housing sidewall 33 is coupled to the first housing sidewall 31, in the front region FA. Therefore, when the flat member 61 is inserted into the coupling groove 37, the third housing sidewall 33 may contact the flat member 61. Therefore, the third housing sidewall 33 may support the flat member 61, and thus, may prevent the display panel 2 from being bent toward the accommodating groove 35 in the inserted state, thereby maintaining flatness of the display panel 2. The coupling groove 37 may be provided to be thicker in thickness than that of the guide groove 311 so that the flat member 61 thicker in thickness than the display panel 2 is inserted thereinto.

The protrusion member 62 may expose a portion, other than a portion of the flat member 61 inserted into the coupling groove 37, of the flat member 61 at the outside of the housing 3. The protrusion member 62 may be provided in a shape which protrudes from the portion, which is not inserted into the coupling groove 37, of the flat member 61. The protrusion member 62 according to an embodiment may protrude from the flat member 61 to the front region FA and may be provided in a shape where a thickness is progressively reduced in the unloading direction (the OD arrow direction). For example, the protrusion member 62 may be provided in a fan shape. In this case, a vertical surface of the protrusion member 62 vertical to the flat member 61 may be supported by the housing 3 in the inserted state. In more detail, the vertical surface of the protrusion member 62 may be supported by the first housing sidewall 31 disposed on the coupling groove 37. Accordingly, the flexible display apparatus 1 according to an embodiment of the present disclosure may provide the following effects.

First, in the flexible display apparatus 1 according to an embodiment of the present disclosure, even when the unloaded state is changed from to the inserted state, the first coupling member 6 may prevent the one side 2c of the display panel 2 from being inserted into the housing 3, thereby maintaining a size of the display panel 2 which is unloaded from the housing 3 and is disposed in the front region FA without a separate fixing device.

Second, in the flexible display apparatus 1 according to an embodiment of the present disclosure, a portion of the flat member 61 may be exposed at the outside due to the protrusion member 62, and thus, the user may easily change the display panel 2 from the inserted state to the unloaded state with holding the flat member 61 or the protrusion member 62 each exposed at the outside.

Third, in the flexible display apparatus 1 according to an embodiment of the present disclosure, since the first coupling member 6 is provided to surround the one side 2c of the display panel 2, the one side 2c of the display panel 2 may be protected from an external impact, thereby more increasing a lifetime of the display panel 2.

The second coupling member 7 may be disposed between the first side 2a and the second side 2b of the display panel 2 and may be coupled to the other side 2d of the display panel 2. The second coupling member 7 according to an embodiment may be coupled to the other side 2d of the display panel 2 by using various coupling methods such as the adhesive coupling method and the fitting-coupling method. The second coupling member 7 may be provided in a rod shape where a cross-sectional surface has either a shape matching the Korean letter "ㄱ", or a V-shape. The second coupling member 7 may be formed of a metal material, but is not limited thereto and may be formed of a plastic material for weight-lightness. The second coupling member 7 may be closely coupled to the display panel 2 from the other side 2d to the first and second sides 2a and 2b of the display panel 2, and thus, flatness of the other side 2d of the display panel 2 may be maintained.

The second coupling member 7, as illustrated in FIG. 6A, may be coupled to the display panel 2 to surround the other side 2d of the display panel 2, and thus, may be supported by the movement part 52 protruding from the rear region BA in the unloaded state. Therefore, in the flexible display apparatus 1 according to an embodiment of the present disclosure, the second coupling member 7 may be closely coupled to the other side 2d of the display panel 2, and thus, may prevent deformation such as the other side 2d of the display panel 2 being crumpled and may protect the other side 2d of the display panel 2 from the movement part 52 in the unloaded state, thereby more increasing a lifetime of the display panel 2.

Referring again to FIGS. 4A to 5A, the flexible display apparatus 1 according to an embodiment of the present disclosure may further include a stepped portion 38.

The stepped portion 38 may support the display panel 2 disposed in the rear region BA. The stepped portion 38 may be provided so that the one side 31a of the first housing sidewall 31 more protrudes to the rear region BA than the other side 31b with respect to the stopper part 5. The stepped portion 38 may long extend from the first support protrusion groove 313 to a portion near an end of the one side 31a of the first housing sidewall 31 and may protrude to the rear region BA. A protrusion thickness of the stepped portion 38 may be equal to or slightly less than a thickness of the frame 4. In this case, a protrusion surface of the stepped portion 38 may contact the guide groove 311. Therefore, the thickness of the guide groove 311 in contact with the stepped portion 38 may be equal to or slightly larger than the thickness of the display panel 2. Therefore, as illustrated in FIG. 4A, the display panel 2 inserted into the guide groove 311 in the inserted state may be disposed in almost parallel to the X-axis direction. That is, the display panel 2 disposed in both sides with reference to the stopper part 5 may be disposed not to be bent or inclined with reference to the stopper part 5. For example, if the stepped portion 38 is not provided, a thickness of the guide groove 311 may be far thicker than that of the display panel 2, and thus, the display panel 2 inserted into the guide groove 311 may be bent and may be damaged due to colliding with the first housing sidewall 31 because the display panel 2 is bent to the front region FA or the rear region BA when the user is moving the display panel 2. Accordingly, in the flexible display apparatus 1 according to an embodiment of the present disclosure, a degree of bending of the display panel 2 caused by the stepped portion 38 or a degree of impact applied to the display panel 2 by the housing 3 may be minimized, thereby more increasing a lifetime of the display panel 2.

Figure 8A:
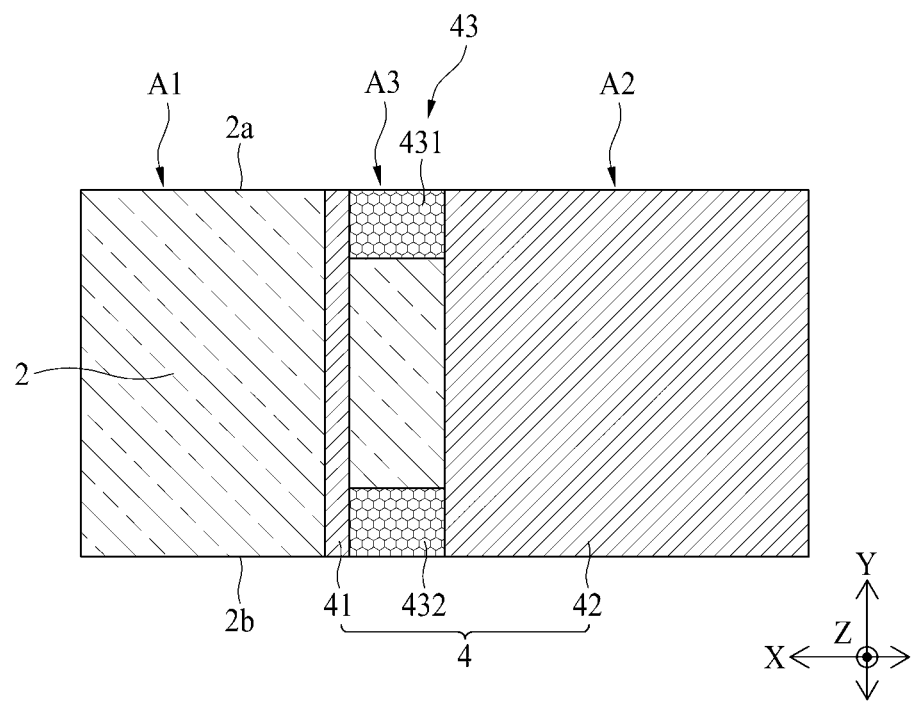
FIG. 8A is a schematic plan view illustrating a frame and a display panel in an inserted state of a flexible display apparatus according to another embodiment of the present disclosure.
Figure 8B:
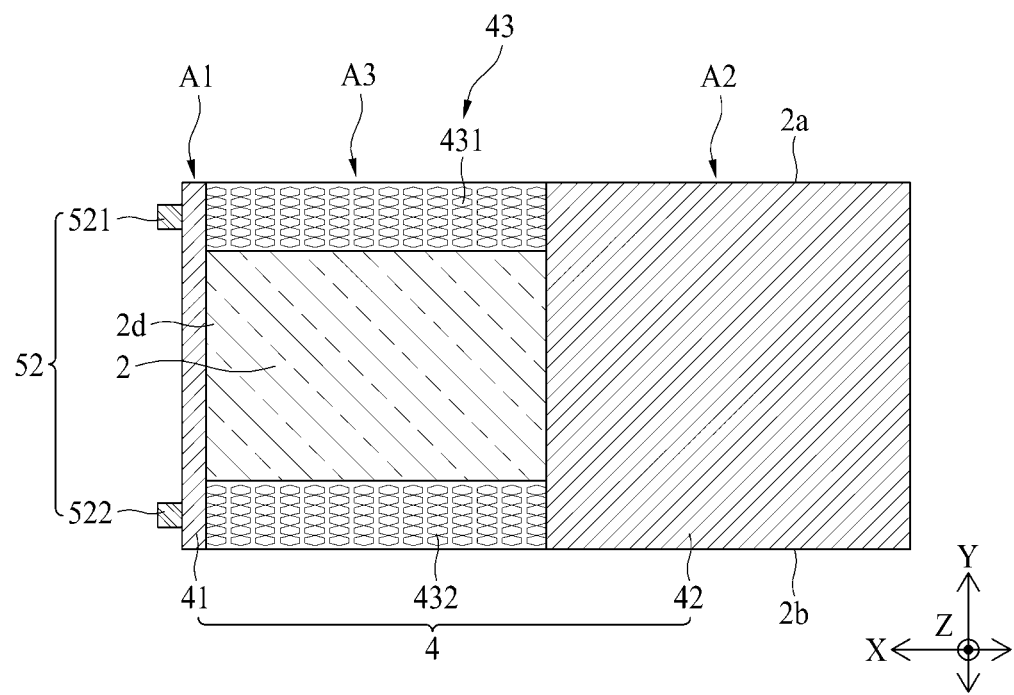
FIG. 8B is a schematic plan view of FIG. 8A in a stretched state.

FIG. 8A is a schematic plan view illustrating a frame and a display panel in an inserted state of a flexible display apparatus 1 according to another embodiment of the present disclosure, and FIG. 8B is a schematic plan view of FIG. 8A in a stretched state.

Referring to FIGS. 8A and 8B, except for that a configuration of an elastic part 43 is changed, the flexible display apparatus 1 according to another embodiment of the present disclosure may be the same as the flexible display apparatus 1 according to an embodiment of the present disclosure described above. Hereinafter, therefore, like reference numerals refer to like elements, and repetitive descriptions of the same elements are omitted.

In the flexible display apparatus 1 according to another embodiment of the present disclosure, the elastic part 43 may be provided to support a portion of a third region A3 of a display panel 2. As seen in FIG. 8A, a portion of the elastic portion 43 may be provided so that a portion thereof is disposed in a first side 2a of the display panel 2 in the third region A3 and the other portion thereof is disposed in the second side 2b. When a portion of the elastic portion 43 disposed in the first side 2a of the display panel 2 is referred to as a first elastic member 431 and a portion of the elastic portion 43 disposed in the second side 2b is referred to as a second elastic member 432, the first elastic member 431 and the second elastic member 432 may be disposed apart from each other by a certain distance in a Y-axis direction. Therefore, in the flexible display apparatus 1 according to another embodiment of the present disclosure, a size of the elastic portion 43 may be reduced more than the flexible display apparatus 1 according to an embodiment of the present disclosure described above, and thus, the manufacturing cost may be reduced and a supporting force for supporting the display panel 2 may be enhanced, thereby more increasing a lifetime of the flexible display apparatus 1.

Referring to FIG. 8B, a first movement part 521 and a second movement part 522 each supporting the other side 2d of the display panel 2 or a second coupling member 7 in the unloaded state may be disposed in parallel with the third region A3 of the display panel 2 where the first elastic member 431 and the second elastic member 432 are provided, with respect to an X-axis direction and may restrain sliding of the display panel 2. In more detail, when the first elastic member 431 disposed in the first side 2a is stretching, the first movement part 521 may support the other side 2d of the display panel 2 disposed in the first side 2a, thereby maintaining the unloaded state of the flexible display apparatus 1. When the second elastic member 432 disposed in the second side 2b is stretching, the second movement part 522 may support the other side 2d of the display panel 2 disposed in the second side 2b, thereby maintaining the unloaded state of the flexible display apparatus 1. That is, the first movement part 521 and the second movement part 522 may be respectively installed in portions to which elastic restoring forces of the first elastic member 431 and the second elastic member 432 are applied in the X-axis direction and may support the display panel 2. Therefore, in the flexible display apparatus 1 according to another embodiment of the present disclosure, a stopper part 5 may support the display panel 2 in only a portion to which the elastic restoring force of the elastic part 43 is applied in the unloaded state, and thus, moving of the display panel 2 in the inserting direction may be efficiently limited and a supporting force of the display panel 2 may be uniformly dispersed to the portion to which the elastic restoring force of the elastic part 43 is applied, thereby preventing deformation such as the display panel 2 being crumpled to maintain flatness of the display panel 2 in the unloaded state.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:
1. A flexible display apparatus comprising:
   a display panel including a first region, a second region, and a third region, wherein the third region is located between the first region and the second region;
   a housing movably supporting the display panel; and
   a frame movably disposed in the housing to stretch or contract based on movement of the display panel, the frame including:
      a first portion fixed to the housing to movably support the first region of the display panel;

a second, sliding portion coupled to the second region of the display panel and movably disposed in the housing; and a third, elastic portion elastically connected to the first portion and to the second, sliding portion to support the third region of the display panel.

2. The flexible display apparatus of claim 1, wherein the housing comprises:

a first housing sidewall supporting a first side edge of the frame;

a second housing sidewall disposed in parallel with the first housing sidewall to support a second side edge of the frame;

a third housing sidewall connected to a first side of the first housing sidewall and to a first side of the second housing sidewall; and a guide roller rotatably connected to a second side of the first housing sidewall opposite to the first side of the first housing sidewall and to a second side of the second housing sidewall opposite to the first side of the second housing sidewall.

3. The flexible display apparatus of claim 1, wherein one or more of the first region, the second region, and the third region display different images.

4. The flexible display apparatus of claim 2, wherein the guide roller supports the third region of the display panel when the display panel is sliding, and the frame stretches or contracts along the guide roller.

5. The flexible display apparatus of claim 1, further comprising a stopper installed in the housing to restrain sliding of the display panel.

6. The flexible display apparatus of claim 5, wherein, when a portion of the second region of the display panel is outside of the housing, the stopper restrains sliding of the display panel.

7. The flexible display apparatus of claim 5, wherein, when the display panel is restrained by the stopper, the frame has a first length, the display panel has a second length, and the first length is the same as the second length.

8. The flexible display apparatus of claim 5, wherein, when restraint of sliding of the display panel by the stopper is released, the frame has a first length, the display panel has a second length, and the first length is smaller than the second length.

9. The flexible display apparatus of claim 5, wherein the stopper comprises:

a first cylindrical body installed in the housing so as to be raised or lowered in a first axial direction; and a second cylindrical body disposed in the housing so as to move in a second axial direction based on of movement of the first cylindrical body.

10. The flexible display apparatus of claim 9, further comprising:

a first elastic member allowing the second cylindrical body to protrude from the housing, based on a first elastic restoring force provided by the first elastic member; and a second elastic member allowing the first cylindrical body to protrude from the housing, based on a second elastic restoring force provided by the second elastic member, wherein the first elastic restoring force is greater than the second elastic restoring force.

11. The flexible display apparatus of claim 5, wherein the housing comprises a stepped portion, wherein a first side of the stepped portion protrudes further to an outer side of the housing than a second side of the stepped portion.

12. The flexible display apparatus of claim 1, wherein the third, elastic portion of the frame supports a portion of the third region of the display panel.

13. The flexible display apparatus of claim 12, further comprising a stopper installed in the housing to restrain sliding of the display panel, wherein the stopper is disposed in parallel with the third region of the display panel supported by the third, elastic portion of the frame, and wherein the stopper restrains sliding of the display panel.

14. An apparatus, comprising:

a housing;

an expandable frame having a first portion directly coupled to the housing, a second portion directly coupled to the first portion, wherein the second portion is elastically expandable, and a third portion directly coupled to the second portion; and a flexible display panel including a first region, a second region adjacent to the first region, and a third region adjacent to the second region, wherein the third region is directly coupled to the third portion of the frame such that the second portion of the frame expands or contracts as the flexible display moves with respect to the housing.

15. The apparatus of claim 14 wherein the first region of the display at least partially overlays the first portion of the frame.

16. The apparatus of claim 14 wherein the second region of the display at least partially overlays the second portion of the frame.

17. The apparatus of claim 14 wherein the third region of the display at least partially overlays the third portion of the frame.

18. The apparatus of claim 14 wherein the first region of the display at least partially overlays a rear surface of the housing.

19. The apparatus of claim 14 wherein the third region of the display at least partially overlays a front surface of the housing.

* * * * *